United States Patent [19]
Holst

[11] Patent Number: 6,153,912
[45] Date of Patent: Nov. 28, 2000

[54] SOI WITH CONDUCTIVE METAL SUBSTRATE USED AS VSS CONNECTION

[75] Inventor: John C. Holst, San Jose, Calif.

[73] Assignee: Advanced Micro Devices, Inc., Synnyvale, Calif.

[21] Appl. No.: 09/427,139

[22] Filed: Oct. 25, 1999

[51] Int. Cl.[7] .......................... H01L 27/01; H01L 27/12; H01L 31/0392

[52] U.S. Cl. ........................................... 257/347; 257/350

[58] Field of Search ................................ 257/57, 60, 66, 257/67, 69, 347, 349, 350, 351, 365, 366

[56] References Cited

U.S. PATENT DOCUMENTS

| | | |
|---|---|---|
| 5,079,607 | 1/1992 | Sakurai . |
| 5,314,841 | 5/1994 | Brady et al. . |
| 5,315,144 | 5/1994 | Cherne . |
| 5,554,870 | 9/1996 | Fitch et al. ............................... 257/334 |
| 5,923,067 | 7/1999 | Voldman ................................. 257/349 |
| 5,945,712 | 8/1999 | Kim ........................................ 257/347 |
| 6,002,154 | 12/1999 | Fujita ...................................... 257/349 |

Primary Examiner—Ngân V. Ngô
Attorney, Agent, or Firm—Amin, Eschweiler & Turocy, LLP

[57] ABSTRACT

An SOI transistor structure and SOI circuit is disclosed. The SOI transistor structure includes a conductive base layer and an insulating layer overlying the conductive base layer. A semiconductor layer overlies the insulating layer and includes a source region and a drain region therein with a channel region disposed therebetween. A conductive gate region overlies generally the channel region of the semiconductor layer. The SOI circuit includes a conductive base layer and an insulating layer overlying the conductive base layer. A semiconductor layer overlies the insulating layer. A first circuit structure and a second circuit structure are formed in a first region and second region of the semiconductor layer, respectively. A conductive contact region extends through the insulating layer and electrically connects at least one of the first circuit structure and the second circuit structure to the conductive base layer.

19 Claims, 9 Drawing Sheets

SOI WITH CONDUCTIVE METAL SUBSTRATE USED AS VSS CONNECTION

FIELD OF THE INVENTION

The present invention generally relates to semiconductor devices and semiconductor processing. More particularly, the present invention relates to a device structure and circuit which uses an SOI MOS type architecture to improve device performance, improve thermal management and improve power supply distribution throughout such a circuit.

BACKGROUND OF THE INVENTION

MOS type transistors are a fundamental building block within integrated circuits. Consequently, there is a persistent push to make such devices smaller, faster, etc. The switching speed of a transistor is obviously an important characteristic since it dictates, at least in one respect, how fast the circuits which employ such devices operate. Presently, the switching speed of a transistor is not limited by the channel transit time (i.e., the time required for charge to be transported across the channel); instead, the switching speed is limited by the time required to charge and discharge the capacitances that exist between the device electrodes and between the interconnecting conductive lines and the substrate.

One way of appreciating the MOS transistor capacitances is through an exemplary cross section, as illustrated in prior art FIG. 1. The transistor, designated at reference numeral 10, includes a p-type region 12 (sometimes referred to as the body), such as a P-well in a CMOS type process. The body 12 has an n-type drain region 14 formed therein and a lightly doped drain extension region 16. Likewise, a source region 18 and a lightly doped source extension region 20 is formed in the body 12. As is well known in the art, the extension regions 16 and 20 often are used to help overcome short channel transistor effects as device dimensions continue to shrink. A doped polysilicon gate 22 overlies a thin gate oxide 24 which defines a channel region 26 therebeneath in the body 12.

An effective circuit diagram illustrating the various transistor capacitances is illustrated in prior art FIG. 2. As seen in prior art FIG. 2, capacitances exist between the various device electrodes and between the electrodes and the body region. The drain-to-body capacitance ($C_{db}$) and the source-to-body capacitance ($C_{sb}$) are illustrated in both prior art FIGS. 1 and 2 and are referred to often as junction capacitances. The value of the junction capacitances are a function of both the cross sectional area of the junctions as well as the doping concentrations of the regions, respectively.

One attempt to increase the performance of the transistor 10 of prior art FIG. 1 reduces the junction capacitances by forming the transistor on an insulating region. Such s a transistor device structure is called a silicon-on-insulator (SOI) device and is illustrated in prior art FIG. 3. The SOI transistor, designated at reference numeral 30, has components similar to the transistor 10 of prior art FIG. 1. In the SOI transistor 30, however, the body 12 is not formed in the bulk semiconductor material 12 as in FIG. 1, but rather overlies an insulating layer 32 such as silicon dioxide ($SiO_2$). The insulating layer 32, in turn, overlies a bulk semiconductor material 34 or other type substrate.

The SOI transistor 30 provides several performance advantages over traditional bulk transistor devices. Initially, since each device can be completely isolated from one another (as opposed to sharing a common body), better individual device isolation is achieved, which prevents circuit latch-up conditions. In addition, since at least a portion of the drain region 14 and the source region 18 abut the insulating layer 34, the cross sectional area of the source/body and drain/body interfaces is reduced and thus the junction capacitance is significantly reduced.

In addition to the aforementioned junction capacitances, the MOS transistor 10 of prior art FIG. 1 exhibits a gate to source capacitance ($C_{gs}$) and a gate to drain capacitance ($C_{gd}$), as highlighted schematically in prior art FIG. 2. The gate to source capacitance ($C_{gs}$) and the gate to drain capacitance ($C_{gd}$) have magnitudes which are a function of the gate, drain and source electrodes, their relative spacing, and the insulative dielectric material therebetween. Similar to the other capacitances described supra, $C_{gs}$ and $C_{gd}$ negatively impact the switching speed of the MOS transistor. As clearly seen in the SOI cross section of prior art FIG. 3, the conventional SOI MOS transistor structure 30 does not reduce or otherwise affect $C_{gs}$ and $C_{gd}$. Therefore although conventional SOI transistors such as the transistor 30 provide improvements in the junction capacitance of the device, other undesirable capacitances still exist and serve to negatively impact transistor performance.

The SOI transistor 30 of prior art FIG. 3 also has another performance disadvantage. The insulating layer 32 generally is thermally insulative compared to the semiconductor material surrounding the layer 32. Therefore, as the SOI transistor 30 operates, heat which would generally dissipate through the substrate 34 in conventional bulk transistor devices 10 tends to build up in the body region 12 of the device. As is well known by those skilled in the art, device heating can lead to device performance degradation parametrically or functionally and can disadvantageously precipitate reliability problems.

Another problem exhibited by conventional bulk transistors 10 and conventional SOI transistors 30 alike relates to a relatively high impedance power supply voltage distribution throughout circuits utilizing such devices. That is, positive and/or negative supply voltages (e.g., $V_{DD}$ and $V_{SS}$) are typically utilized throughout various portions of an integrated circuit chip to power the chip as needed. Such supply voltages are often distributed to various locations about the chip on supply voltage buses. However, the conductivity of the buses is directly related to their size. Therefore in order to reduce the impedance of the buses to negligible levels, the buses must be very large, which can negatively impact the integrated circuit die size and/or make circuit layout substantially more difficult, which increases the die cost.

Since die sizes cannot be excessively large, the supply voltage buses exhibit a modest amount of impedance. In addition, the individual conductive lines which carry the supply voltage from the bus or rail to each device also exhibits an impedance, which negatively impacts circuit performance. Schematically, this phenomena may be modeled as illustrated in prior art FIGS. 4a and 4b. In FIG. 4a, two MOS transistors 50 and 52 are each connected to the positive supply voltage rail or bus at different locations on the semiconductor die. Because the supply voltage bus exhibits a non-zero impedance (illustrated $R_{DD}$ in prior art FIG. 4a), the magnitude of the supply voltage differs at different locations about the chip ($V_{DD} \neq V_{DD}'$). Similarly, negative supply voltages may also differ, as illustrated in prior art FIG. 4b (i.e., $V_{SS} \neq V_{SS}'$).

The impedance within the power supply distribution system on a chip has several negative consequences. For example, since different portions of the circuit have different power supply voltage magnitudes applied thereto, transistors will perform slightly differently across the chip. These differences may negatively impact the timing at which various transistors switch, etc. In addition, the impedance along the supply voltage buses result in undesirable power dissipation and "IR" heating within the chip.

Therefore there is a need in the art for a transistor structure and circuit which exhibit reduced capacitance, improved thermal management and improved power supply voltage distribution throughout the chip.

SUMMARY OF THE INVENTION

The present invention relates to an SOI transistor structure having a conductive base layer underlying the insulating layer which provides for a low impedance power supply voltage distribution system, reduced capacitance and improved thermal management.

According to one aspect of the present invention, an SOI transistor structure is disclosed having a conductive base layer which may form the circuit substrate or may alternatively overlie a circuit substrate. Overlying the conductive base layer is an insulating layer over which a semiconductor layer is formed. The SOI transistor is formed in the semiconductor layer and a portion of the SOI transistor is electrically connected to the conductive base layer through a conductive contact region which extends through the insulating layer. The conductive base layer allows a low impedance supply voltage to be easily provided to the desired portion of the SOI transistor and thereby reduces conventional interconnect means between the SOI transistor and a power supply voltage. Therefore the power supply voltage supplied across the chip to any circuit component thereon is substantially the same, thereby improving SOI circuit performance.

According to another aspect of the present invention, an SOI circuit is disclosed and includes a conductive base layer and an insulating layer lying thereover. A semiconductor layer overlies the insulating layer and includes first and second circuit structures (e.g., MOS type transistors) therein. A conductive contact region extends through the insulating layer and provides electrical contact down to the conductive base layer for one or more of the circuit structures. In so doing, multiple circuit structures may be formed having a low impedance supply voltage coupled thereto via the conductive contact region.

According to yet another aspect of the present invention, the conductive contact region is operable to electrically couple a portion of a circuit structure (e.g., a drain region or a source region of a MOS type transistor) to the conductive base layer. Because of the electrical connection via the conductive contact region, a surface level contact from a power supply bus or rail to either the drain region or the source region is eliminated, thereby substantially reducing the gate to drain capacitance or the gate to source capacitance, respectively. The reduction in capacitance results in a substantial improvement in SOI transistor performance. In addition, the conductive contact region provides a thermally conductive path which transfers heat away from the circuit structures formed above the insulating layer. Therefore the conductive contact region provides for improved thermal management of the SOI circuitry.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed toward an SOI transistor structure, associated circuit and method of manufacture which provides improved performance over conventional structures and circuits. The structure includes an SOI transistor, wherein the insulating layer overlies a conductive base layer. A conductive contact region extends through the insulating layer and provides electrical contact between the conductive base layer and a portion of the SOI transistor. By applying a voltage potential such as a power supply voltage to the conductive base layer, the base layer serves as an extremely low impedance power supply bus that supplies a power supply voltage to the selected portion of the SOI transistor. In addition, the conductive contact region provides a thermally conductive path between the SOI transistor and the conductive base layer and advantageously transfers heat generated during transistor operation away from the circuitry in an effective manner.

Figure 5:
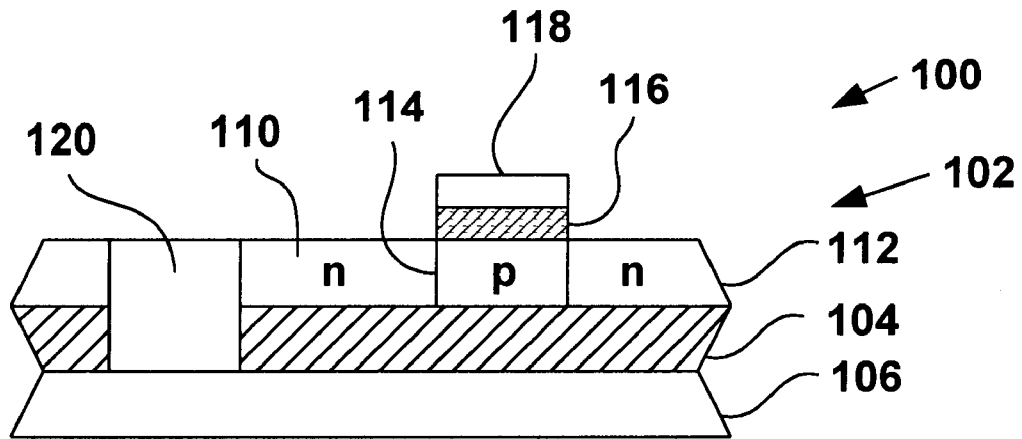
FIG. 5 is a fragmentary cross section diagram illustrating an SOI transistor structure according to the present invention.

Turning now to the Figures, FIG. 5 is a fragmentary cross section diagram illustrating an SOI transistor structure 100 according to an exemplary embodiment of the present invention. The transistor 100 includes a semiconductor layer 102 such as silicon overlying an insulating layer 104 such as silicon dioxide ($SiO_2$). The insulating layer 104 in turn overlies a conductive base layer 106 which serves as the substrate for the structure 100. According to a preferred embodiment of the present invention, the conductive base layer 106 is a metal substrate having a high conductivity such as aluminum, copper, etc., however, other conductive materials may also be utilized and are contemplated as falling within the scope of the present invention. For example, a heavily doped polysilicon material may be employed.

The SOI transistor structure 100 includes transistor regions formed in the semiconductor layer 102. For example, if the SOI transistor structure 100 is an n-channel MOS type transistor, the structure includes n-type source and drain regions 110 and 112 and a p-type channel region 114. In addition, a gate oxide 116 and a conductive gate electrode 118 is formed on a top surface 119 of the semiconductor layer 102 over the channel region 114.

The SOI transistor structure 100 also includes a conductive contact region 120 which extends through the insulating layer 104 and makes electrical contact to both a portion of the transistor in the semiconductor layer 102 and the conductive base layer 106. Preferably, the conductive contact region 120 is made of a highly conductive material such as tungsten, copper, aluminum, etc., however, any conductive material may be utilized and is contemplated as falling within the scope of the present invention. As illustrated in the exemplary embodiment of FIG. 5, the conductive contact region couples the source region 110 of the transistor to the conductive base layer 106. Using the structure 100, a power supply voltage such as a negative supply voltage $V_{SS}$ may be supplied to the source region 110 without a "top-side" contact. In addition, since the thickness of the conductive base layer 106 may be made substantially thick, the impedance of the power supply distribution via the conductive base layer 106 is negligibly small compared with conventional supply voltage distribution schemes.

Figure 1:
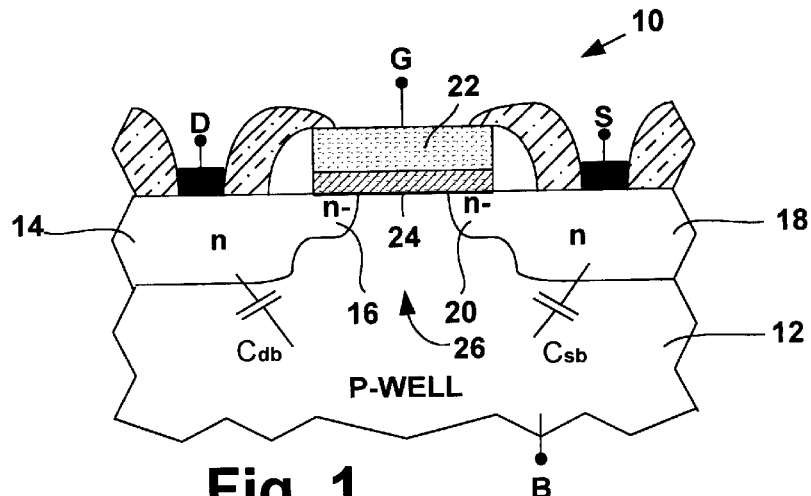
FIG. 1 is a fragmentary cross section diagram illustrating a prior art MOS type transistor structure.
Figure 2:
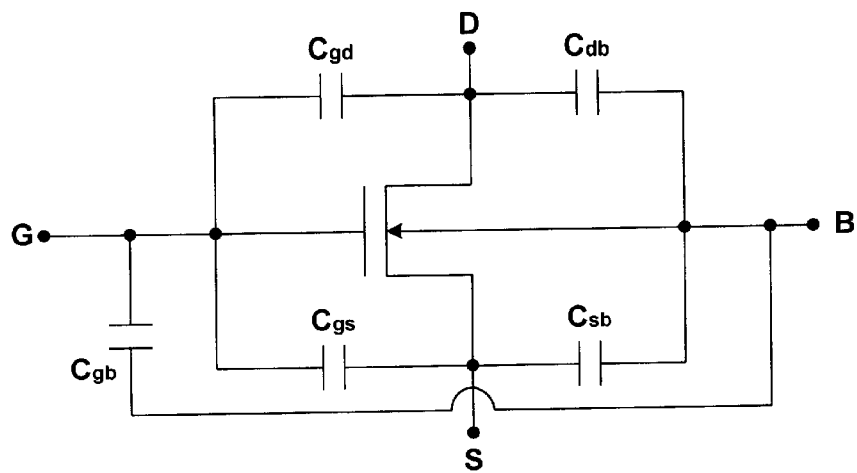
FIG. 2 is a circuit diagram illustrating the effective capacitances in the MOS transistor structure of prior art FIG. 1.
Figure 3:
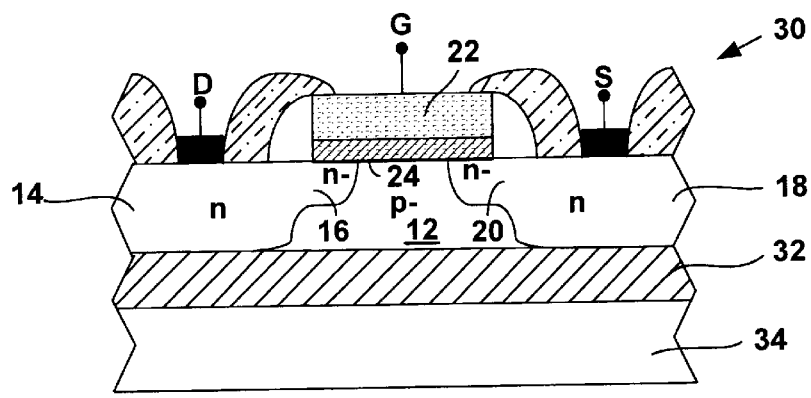
FIG. 3 is a fragmentary cross section diagram illustration a prior art SOI MOS type transistor structure.

The SOI transistor structure 100 of FIG. 5 also provides another advantage over conventional structures. Because the conductive contact region 120 (which acts as the source contact) laterally abuts the source region 110 instead of lying thereover on the transistor surface 119, the distance between the source electrode 120 and the gate electrode 118 is substantially larger than the conventional device 30 of prior art FIG. 3. The capacitance between the gate electrode and the source electrode is defined by:

$$C = kA/d,$$

wherein k is related to the dielectric constant of the material between the electrodes, A is the cross sectional area of the electrodes, and d is the distance therebetween. As can be seen by the above equation, as the distance between the electrodes increases, the gate to source capacitance ($C_{gs}$) of the transistor structure 100 is reduced, which serves to improve the transistor performance.

In the exemplary embodiment of the invention illustrated in FIG. 5, the conductive contact region 120 couples the source region 110 to the conductive base layer potential. Alternatively, however, the conductive contact region 120 may be located to couple the drain region 112 or the channel region 114 to the base layer potential, as may be desired. In any event, use of the very low impedance conductive base layer 106 in conjunction with the conductive contact region 120 which extends through the insulating layer 104 provides a voltage potential to a portion of the SOI transistor in a reliable manner and may provide a reduction in the gate to source or the gate to drain capacitance, respectively.

In the exemplary embodiment of FIG. 5, the conductive base layer 106 serves as the structure substrate. Alternatively, the SOI structure 100 may have the conductive base layer 106 overlying another layer 122 which serves as a substrate, for example, an insulator such as glass or a ceramic, or a semiconductor material such as silicon. Such an exemplary structure is illustrated in the fragmentary cross section of FIG. 6.

Figure 6:
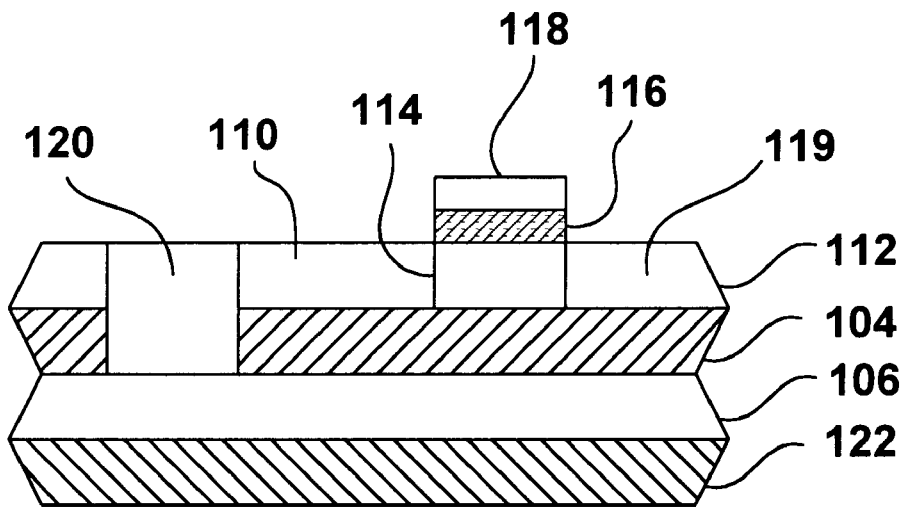
FIG. 6 is a fragmentary cross section diagram illustrating an SOI transistor structure according to another embodiment of the present invention.
Figure 7A:
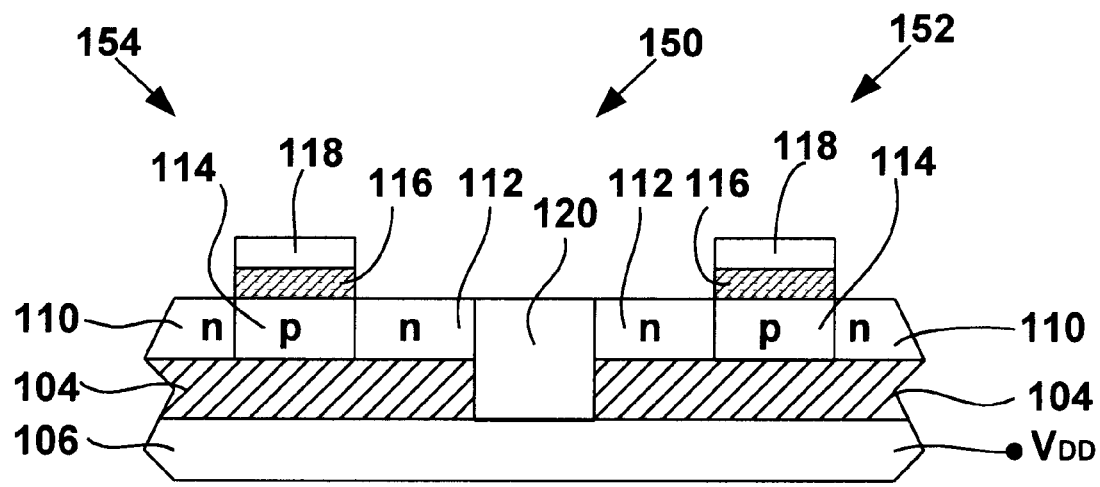
FIG. 7a is a fragmentary cross section diagram illustrating an SOI circuit configuration according to the present invention.

The SOI structure 100 of FIGS. 5 or 6 may be utilized in conjunction with multiple devices on a semiconductor die or in conjunction with an SOI circuit arrangement, as illustrated in FIG. 7a and designated at reference numeral 150. In the circuit 150, two n-channel transistors 152 and 154 are constructed in accordance with the SOI transistor structure of FIG. 5, wherein the drain regions 112 of each of the devices laterally abut and make electrical contact with the conductive contact region 120. By applying a voltage potential to the conductive base layer 106, for example, a positive supply voltage $V_{DD}$, a low impedance supply distribution is achieved in the circuit 150. In addition, although the transistors 152 and 154 are shown adjacent to one another, each transistor may be located anywhere on the semiconductor die and easily connect to the same supply voltage $v_{DD}$ via a conductive contact region 120 and the conductive base layer 106.

Figure 4A:
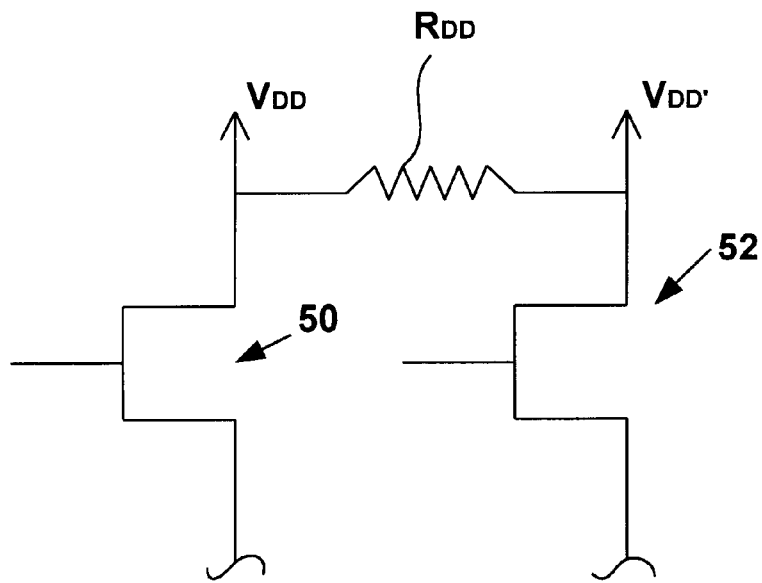
FIGS. 4a–4b are prior art schematic diagrams illustrating the impact of a power supply bus or rail in an integrated circuit having a non-negligible impedance associated therewith and the impact such an impedance has on a circuit employing such a power supply bus or rail.
Figure 4B:
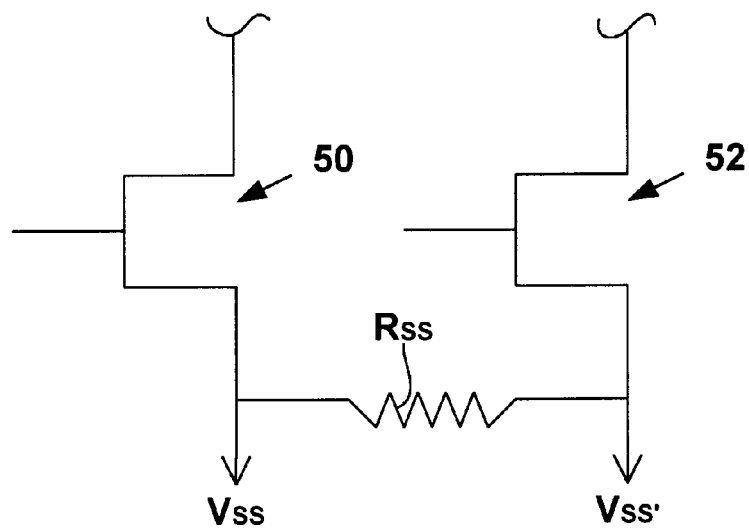
Figure 7B:
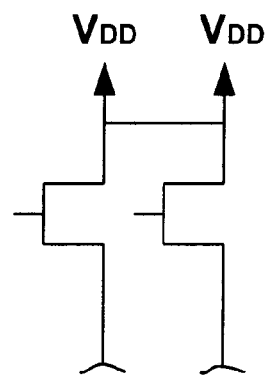
FIG. 7b is a schematic diagram illustrating how the SOI circuit configuration of FIG. 7a provides for improved circuit performance.

Because the impedance of the conductive base layer 106 is negligibly small, the supply voltage potential which is applied to any transistor in the SOI circuit has substantially the same potential thereat, thereby improving the performance uniformity of the various transistors across the die. Schematically, the structure 150 of FIG. 7a can be represented as illustrated in FIG. 7b. In contrast to prior art FIG. 4a which represents conventional circuit arrangements, the power supply impedance $R_{DD}$ of the present invention is effectively zero and therefore all the drain regions of such structures so connected are effectively shorted together via the conductive base layer 106 as shown in FIG. 7b.

Figure 8A:
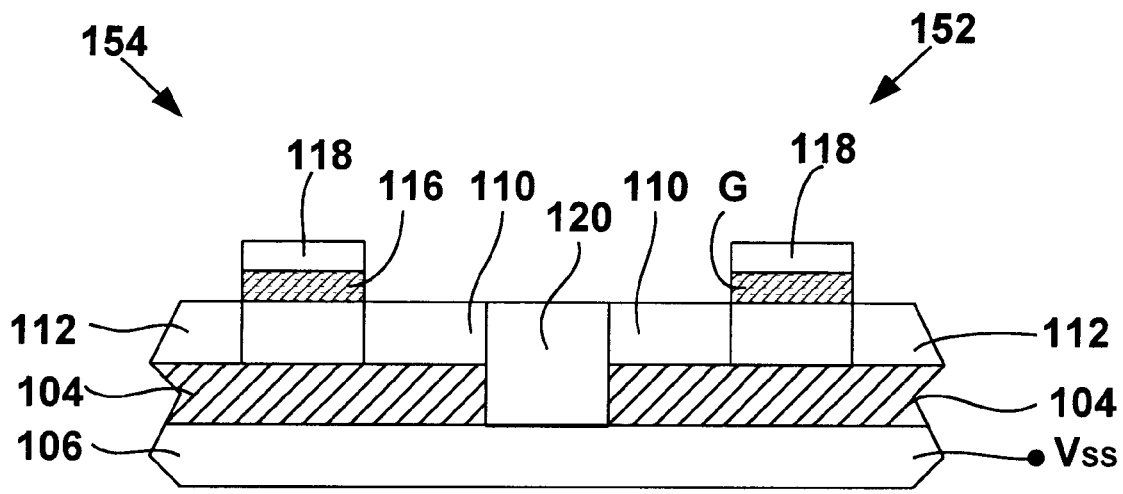
FIG. 8a is a fragmentary cross section diagram illustrating another SOI circuit configuration according to the present invention.
Figure 8B:
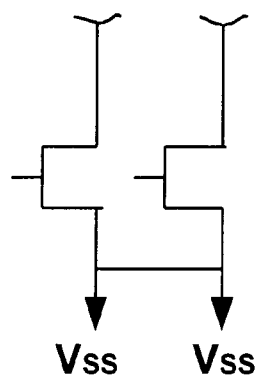
FIG. 8b is a schematic diagram illustrating how the SOI circuit configuration of FIG. 8a provides for improved circuit performance.

Although FIG. 7a illustrates an exemplary embodiment in which the circuit has the drain regions 112 of multiple MOS transistors coupled to the conductive base layer 106 via the conductive contact region 120, other circuit arrangements can be utilized and are contemplated as falling within the scope of the present invention. For example, as illustrated in FIG. 8a, the source regions 110 of the transistors 152 and 154 may be coupled to the conductive contact region 120. In such a circuit configuration, a voltage potential such as a negative supply potential $V_{SS}$ may be applied to the conductive base layer 106 which provides a circuit schematic such as that illustrated in FIG. 8b. Similarly, any transistor on the semiconductor die may be similarly connected to the low impedance conductive base layer 106 using a conductive contact region 120 extending through the insulating layer 104.

In addition, although FIGS. 7a and 8a illustrate circuit arrangements using only n-channel MOS type transistors, it should be understood that any type of circuit structure may be formed in the semiconductor layer 102 and is contemplated as falling within the scope of the present invention.

For example, p-channel MOS type transistors, bipolar transistors, capacitors, resistors, etc. may be utilized. In addition, a drain of one n-channel MOS transistor may couple to the conductive layer 106 via a conductive contact region while another n-channel MOS transistor may have a source region connected to the conductive base layer 106 through a conductive contact region 120 to effectuate different kinds of circuit configurations, as may be desired. In addition, although the above exemplary embodiments applied a positive or negative supply voltage to the conductive base layer 106, any potential may be utilized.

Figure 9:
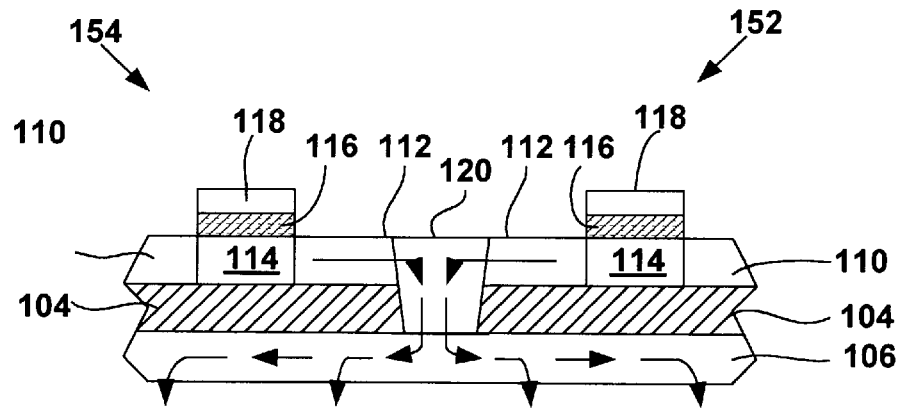
FIG. 9 is a fragmentary cross section diagram illustrating how the SOI circuit configuration of the present invention provides a thermally conductive path to the conductive base layer to transfer heat away from the SOI circuit.

In addition to the advantages highlighted above, the SOI circuit arrangement of the present invention also provides a thermally conductive path for heat generated in the semiconductor layer 102 to be effectively transferred away from the transistor, thereby improving SOI circuit performance and reliability. As is well known by those skilled in the art, conventional SOI transistor circuits suffer problems associated with heat because the insulating layer 104 generally is not thermally conductive. Therefore heat generated by current conduction, etc. through the SOI circuits tends to accumulate, which undesirably impacts a circuit's parametric performance, functional performance and reliability. As illustrated in FIG. 9, as heat is generated in the semiconductor layer 102 during transistor conduction, etc., the conductive contact region 120 is thermally conductive as well as electrically conductive, and serves as a thermal conduit through the insulating layer 104 down to the conductive base layer 106, wherein heat can dissipate effectively through the conductive base layer and to the circuit package. Therefore the circuit configuration of the present invention provides for a substantial improvement in thermal management of the circuit over conventional structures.

Figure 10:
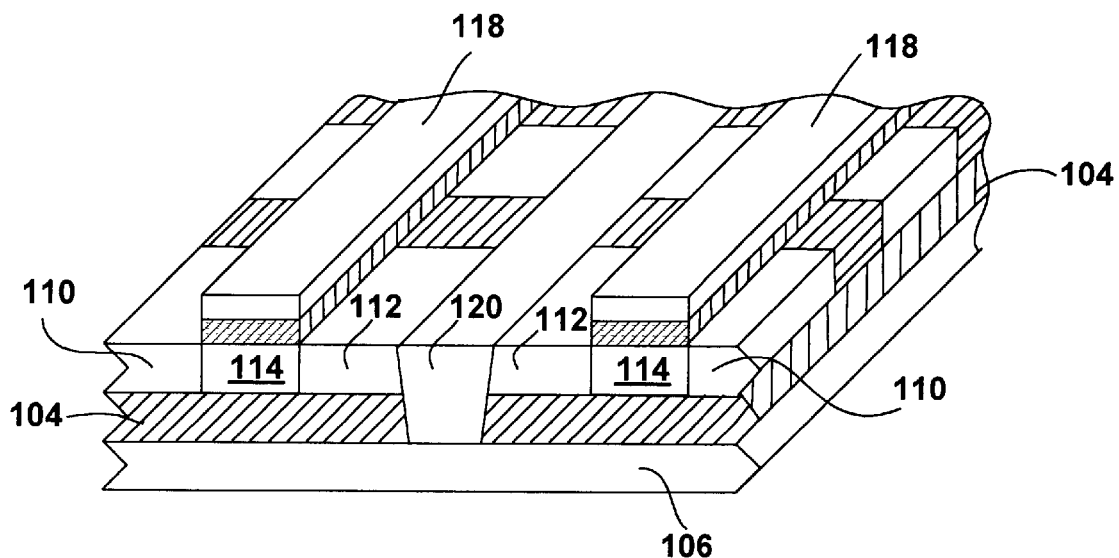
FIG. 10 is a fragmentary perspective view illustrating the SOI circuit configuration of the present invention according to one exemplary embodiment.

It should be noted that the conductive contact region 120 can act as a single conductive "plug" to selectively couple a transistor portion to the conductive base layer 106. Alternatively, however, the conductive contact region 120 may extend laterally across multiple transistors, thereby acting as a contact bus or rail and thus further improving circuit performance by reducing the contact resistance between the transistors and the conductive base layer 106, as illustrated in the exemplary fragmentary perspective view of FIG. 10.

Figure 11A:
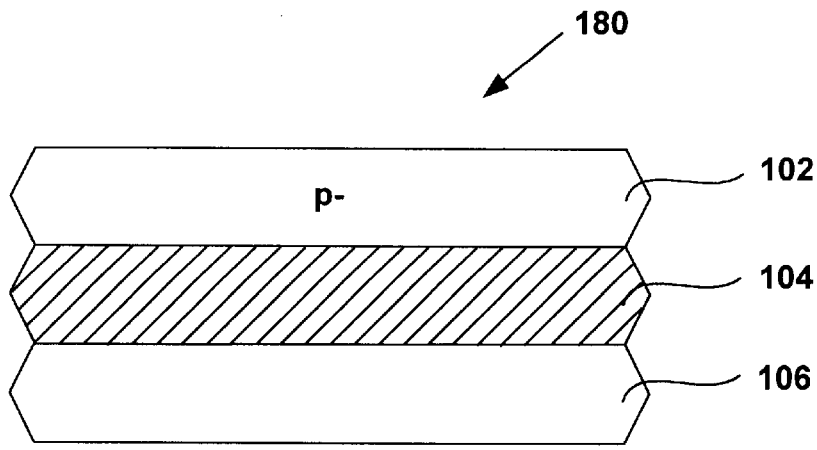
FIGS. 11a–11g are fragmentary cross section diagrams illustrating a method of manufacturing the SOI circuit configuration of FIG. 7a according to the present invention.
Figure 11B:
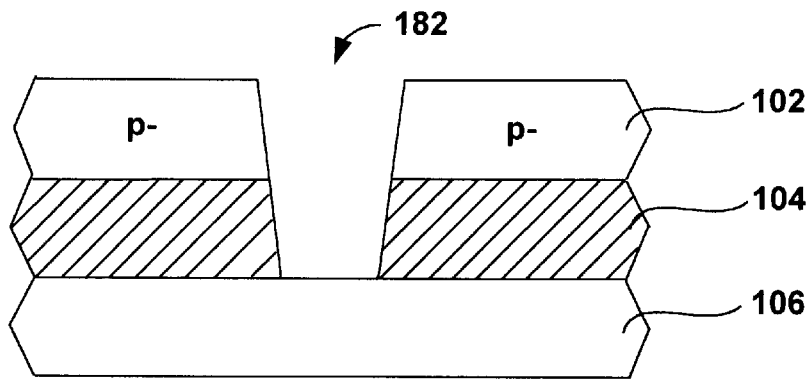

A method for constructing an SOI circuit configuration such as the configuration 150 of FIG. 7a now will be discussed below in conjunction with FIGS. 11a–11g. In FIG. 11a, a multi-layer sandwich 180 including the conductive base layer 106, the insulating layer 104 and the semiconductor layer 102 is formed. The multi-layer structure 180 may be generated in accordance with various fabrication techniques and each is contemplated as falling within the scope of the present invention. For example, the insulating layer 104 may be formed over the semiconductor layer 102 (e.g., a p-type material) using thermal growth or deposition techniques and the conductive base layer 106 may then be formed over the insulating layer 104 using, for example, sputtering, chemical vapor deposition (CVD), etc. The structure 180 is then flipped and a contact hole 182 is formed via, for example, an anisotropic dry etch in the semiconductor layer 106, as illustrated in FIG. 11b.

Figure 11C:
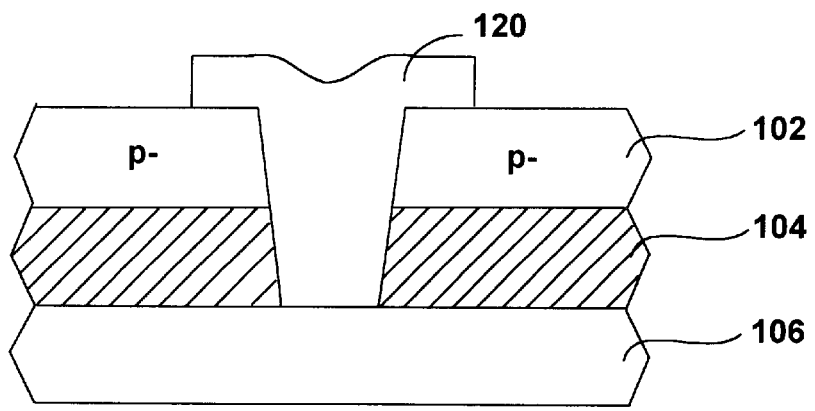
Figure 11D:
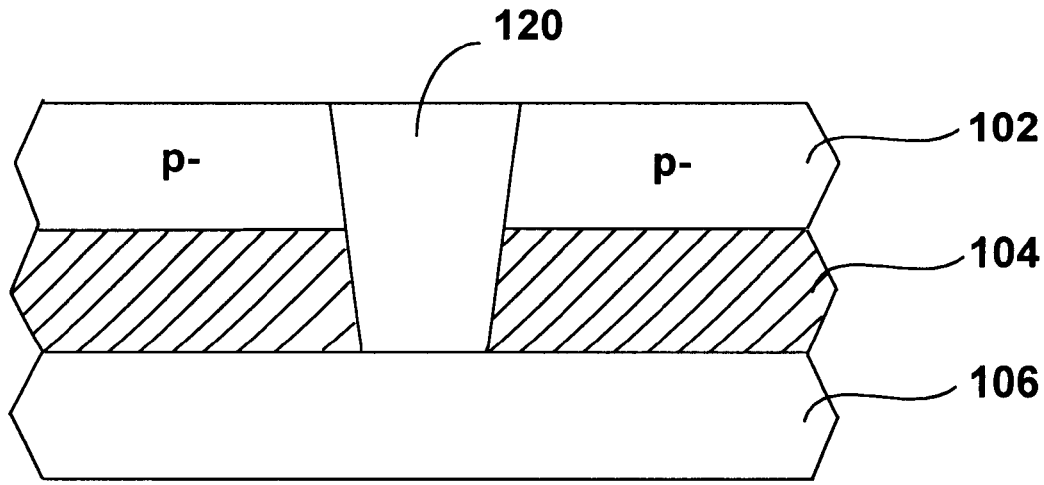
Figure 11E:
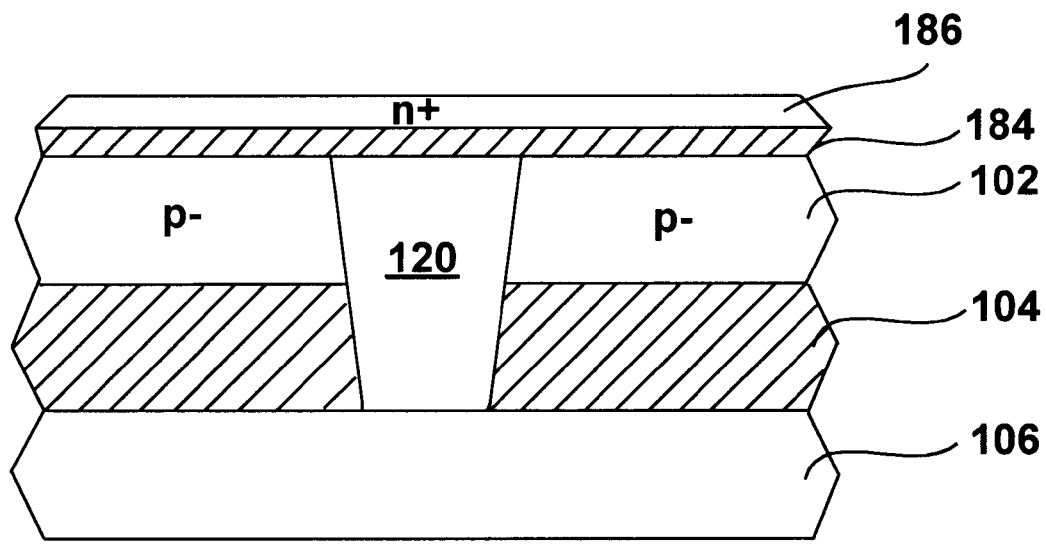
Figure 11F:
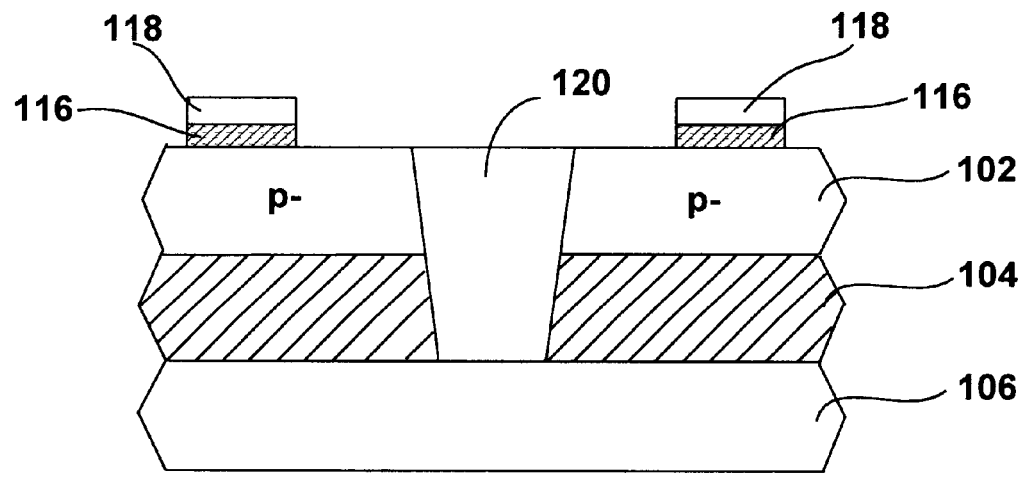

The contact hole 182 is then filled with a conductive material such as tungsten, aluminum, doped polysilicon, etc. to formed the conductive contact region 120, as illustrated in FIG. 11c. A planarization technique is then preferably employed, for example, by performing a chemical-mechanical polish (CMP) to remove portions of the region 120 above the semiconductor layer 102, as illustrated in FIG. 11d. A thin oxide film 184 and a conductive film (e.g., doped polysilicon) 186 are then formed over the semiconductor layer 102 and the conductive contact region 120, as illustrated in FIG. 11e, and patterned to form the gate oxides 116 and the gate electrodes 118, as illustrated in FIG. 11f. Any conventional deposition and pattern formation techniques may be utilized and are contemplated as falling within the scope of the present invention.

Figure 11G:
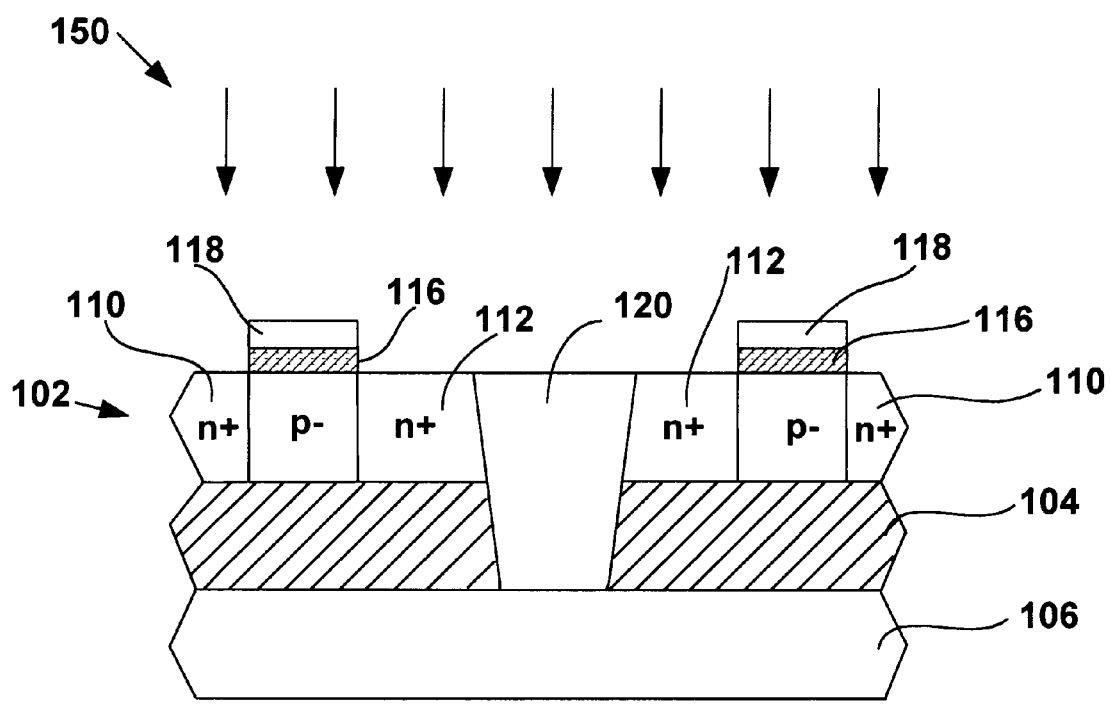

Lastly, an ion implantation (or alternatively, a diffusion) is performed to form the source and drain regions 110 and 112, respectively, using the gates 118 to self-align the regions 110 and 112, as illustrated in FIG. 11g. As a result, an SOI circuit 150 is generated having the advantageous features highlighted above.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An SOI transistor structure, comprising:

a conductive base layer comprising a metal;

an insulating layer overlying the conductive base layer;

a semiconductor layer overlying the insulating layer, wherein the semiconductor layer includes a source region and a drain region therein with a channel region disposed therebetween;

a conductive gate region overlying generally the channel region of the semiconductor layer; and a conductive contact region extending through the insulating layer, wherein the conductive contact region electrically connects one of the source region, the drain region and the channel region to the base conductive layer.

2. The SOI transistor structure of claim 1, wherein the conductive base layer comprises copper.

3. The SOI transistor structure of claim 1, wherein the conductive base layer is at a predetermined voltage potential and the conductive contact region electrically connects the source region to the predetermined voltage potential, and wherein the conductive contact region reduces a gate to source capacitance of the SOI transistor structure.

4. The SOI transistor structure of claim 1, wherein the conductive base layer is at a predetermined voltage potential and the conductive contact region electrically connects the drain region to the predetermined voltage potential, and wherein the conductive contact region reduces a gate to drain capacitance of the SOI transistor structure.

5. The SOI transistor structure of claim 1, wherein the conductive base layer comprises a substrate of the SOI transistor.

6. The SOI transistor structure of claim 1, further comprising a semiconductor substrate layer underlying the conductive base layer.

7. An SOI circuit, comprising:

a conductive base layer comprising a metal;

an insulating layer overlying the conductive base layer;

a semiconductor layer overlying the insulating layer;

a first circuit structure formed in a first region of the semiconductor layer;

a second circuit structure formed in a second region of the semiconductor layer, wherein portions of the first circuit structure and the second circuit structure are electrically connected together; and a conductive contact region extending through the insulating layer and electrically connecting at least one of the first circuit structure and the second circuit structure to the conductive base layer.

8. The SOI circuit of claim 7, wherein the conductive contact region electrically connects the first circuit structure and the second circuit structure together and electrically connects the portions of the first circuit structure and the second circuit structure to the conductive base layer.

9. The SOI circuit of claim 7, wherein the conductive base layer is at a predetermined voltage potential and supplies the predetermined voltage potential to the at least one of the first circuit structure and the second circuit structure.

10. The SOI circuit of claim 7, wherein the first circuit structure and the second circuit structure comprise n-channel MOS type transistors, each having a drain, a source and a channel disposed between the source and drain, respectively, and wherein the conductive contact region electrically connects the sources of the MOS type transistors together and to the conductive base region.

11. The SOI circuit of claim 10, wherein the conductive base layer is at a $V_{SS}$ circuit supply potential and supplies the $V_{SS}$ circuit supply potential to the sources of the n-channel MOS type transistors.

12. The SOI circuit of claim 7, wherein the first circuit structure and the second circuit structure comprise n-channel MOS type transistors, each having a drain, a source and a channel disposed between the source and drain, respectively, and wherein the conductive contact region electrically connects the drains of the MOS type transistors together and to the conductive base region.

13. The SOI circuit of claim 12, wherein the conductive base layer is at a $V_{DD}$ circuit supply potential and supplies the $V_{DD}$ circuit supply potential to the drains of the n-channel MOS type transistors.

14. An SOI integrated circuit, comprising:

a conductive layer comprising a metal having a predetermined voltage potential applied thereto;

an insulating layer overlying the conductive layer;

a semiconductor layer overlying the insulating layer;

a conductive contact region electrically contacting the semiconductor layer, the conductive contact region extending through the insulating layer and electrically contacting the conductive layer; and a first circuit structure formed in the semiconductor layer, the first circuit structure having a portion electrically connected to the conductive layer through the conductive contact region.

15. The SOI integrated circuit of claim 14, further comprising a second circuit structure formed in the semiconductor layer, the second circuit structure having a portion electrically connected to the conductive layer through the conductive contact region.

16. The SOI integrated circuit of claim 15, wherein the first circuit structure and the second circuit structure are n-channel MOS type transistors, each having a drain, a source and a channel disposed between the drain and the source, respectively, wherein the sources of the n-channel MOS transistors both are connected to the conductive layer via the conductive contact region and therefore have the predetermined voltage potential applied thereto.

17. The SOI integrated circuit of claim 16, wherein the predetermined voltage potential comprises a negative supply potential.

18. The SOI integrated circuit of claim 15, wherein the first circuit structure and the second circuit structure are n-channel MOS type transistors, each having a drain, a source and a channel disposed between the drain and the source, respectively, wherein the drains of the n-channel MOS transistors both are connected to the conductive layer via the conductive contact region and therefore have the predetermined voltage potential applied thereto.

19. The SOI integrated circuit of claim 18, wherein the predetermined voltage potential comprises a positive supply potential.

* * * * *

UNITED STATES PATENT AND TRADEMARK OFFICE
CERTIFICATE OF CORRECTION

| | | |
|---|---|---|
| PATENT NO. | : 6,153,912 | Page 1 of 1 |
| DATED | : November 28, 2000 | |
| INVENTOR(S) | : John C. Holst | |

It is certified that error appears in the above-identified patent and that said Letters Patent is hereby corrected as shown below:

Title page,
Assignee; please replace the word "Synnyvale" with -- Sunnyvale --.

Column 1,
Line 52, please delete the letter "s" after the word Such.

Column 6,
Line 32, please delete replace "$v_{DD}$" with -- $V_{DD}$ --.

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*